United States Patent
Howser et al.

[11] Patent Number: 6,054,764
[45] Date of Patent: *Apr. 25, 2000

[54] INTEGRATED CIRCUIT WITH TIGHTLY COUPLED PASSIVE COMPONENTS

[75] Inventors: James H. Howser, Richardson; Tom L. Fowler, Garland, both of Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/992,701

[22] Filed: Dec. 17, 1997

Related U.S. Application Data

[60] Provisional application No. 60/034,260, Dec. 20, 1996.

[51] Int. Cl.[7] ............................ H01L 23/495; H01L 23/34
[52] U.S. Cl. ............................................. 257/724; 257/666
[58] Field of Search ..................................... 257/666, 723, 257/724

[56] References Cited

U.S. PATENT DOCUMENTS

| | | |
|---|---|---|
| 4,028,722 | 6/1977 | Helda . |
| 5,592,020 | 1/1997 | Nakao et al. ............................ 257/666 |
| 5,719,436 | 2/1998 | Kuhn ........................................ 257/676 |
| 5,767,564 | 6/1998 | Kunimatsu et al. .................... 257/532 |
| 5,793,108 | 8/1998 | Nakanishi et al. ..................... 257/723 |

FOREIGN PATENT DOCUMENTS 63-211663  9/1988  Japan ..................................... 257/724

*Primary Examiner*—David E. Graybill
*Attorney, Agent, or Firm*—Wade James Brady, III; Frederick J. Telecky, Jr.

[57] ABSTRACT

A multi-component electronic assembly (100) including a leadframe (101) having upper and lower surfaces and a plurality of conductive leads (203). Each lead (203) has first bonding surfaces (201) on the upper surface of each lead and second bonding surfaces (201) on the lower surface of each lead (203). Preferably, each lead has a plurality of third bonding surfaces (202) formed on at least some of the plurality of leads where the third bonding surfaces (202) are formed by conductive extensions of the leads (203) that extend towards the center of the assembly (100). A first passive component (102) is electrically and mechanically coupled to the first bonding surfaces. A second passive component (104) is electrically and mechanically coupled to the second bonding surfaces. Where third bonding surfaces (202) are used, a third component (103) is electrically and mechanically coupled to the third bonding surfaces (202).

9 Claims, 2 Drawing Sheets

6,054,764

INTEGRATED CIRCUIT WITH TIGHTLY COUPLED PASSIVE COMPONENTS

This application claims priority under 35 USC §119(e)(1) of provisional application No. 60/034,260 filed Dec. 20, 1996.

BACKGROUND OF THE INVENTION

1. Government License Rights

The U.S. Government has a paid-up license in this invention and the right in limited circumstances to require the patent owner to license others on reasonable terms as provided for by the terms of contract No. DAAL01-95-C-3525 awarded by DARPA.

2. Field of the Invention

The present invention relates, in general, to multi-component electronic circuits, and more specifically, to an assembly and method for assembling an integrated circuit that is tightly coupled to inductor and capacitor elements on a single leadframe.

3. Relevant Background

Many passive components (e.g., capacitors, inductors and resistors) cannot be cost effectively integrated onto a monolithic integrated circuit because of their size. Also, the limitations in a particular integrated circuit processing technology may prohibit processing of inductors or high valued capacitors and resistors into the integrated circuit. Typically, large valued inductors and capacitors are manufactured as separate components and interconnected with the integrated circuit to provide the desired functionality.

For example, in power supplies such as AC-DC and DC-DC converters, large value inductors and capacitors are required that cannot be provided on the integrated circuit. Most such circuits are manufactured using multiple components interconnected by printed wiring on a circuit board. However, there is increasing demand for single device solutions for power supply circuits to reduce overall system size.

It is desirable from a manufacturer's and user's standpoint that packaged circuits require as few external components as possible. This eases assembly and lowers costs for the end user while increasing value added to the manufacturer. Hence, integrated circuit manufacturers are increasingly offering multi-component modules that include one or more integrated circuit chips packaged together with external passive components such as inductive and capacitive elements.

Another advantage of multi-component packaging is that stray and parasitic capacitance and inductance associated with leads and circuit board traces can be eliminated. However, stray capacitance and inductance associated with wire bonds connecting multiple chips remains a problem. In conventional multi-component modules, components are mounted on a substrate or leadframe in the same plane and coupled together by wire bonds. This "planar" arrangement results in large packages, making the packages more difficult to use, expensive to manufacture and costly in terms of circuit board real estate for the user.

Some attempts have been made to vertically stack integrated circuits with associated passive components. Some of these efforts require three dimensionally formed leadframes that are difficult to manufacture and difficult to work with on an assembly line. Also, the integrated circuits could be left exposed on the surfaces of the vertical stack. Moreover, existing vertically stacked assemblies require relatively difficult assembly, adding to the production cost of the component. It is desirable to use planar leadframes and to avoid exposure of the integrated circuit chip.

SUMMARY OF THE INVENTION

The present invention involves a multi-component electronic assembly including a leadframe having upper and lower surfaces and a plurality of conductive leads. The leadframe includes first bonding surfaces on the upper surface of each lead and second bonding surfaces on the lower surface of each lead. Preferably, each lead has a plurality of third bonding surfaces formed on at least some of the plurality of leads where the third bonding surfaces are formed by conductive extensions of the leads that extend towards the center of the assembly. A first component is electrically and mechanically coupled to the first bonding surfaces. A second component is electrically and mechanically coupled to the second bonding surfaces. Where third bonding surfaces are used, a third component is electrically and mechanically coupled to the third bonding surfaces.

Another aspect of the present invention is a leadframe having a plurality of leads, each lead having first, second, and third bonding surfaces and having a terminal end for coupling the first, second and third bonding surfaces to external electrical circuitry.

In another aspect, the present invention involves a method for assembling a multi-component electronic assembly including the steps of providing a leadframe having upper and lower surfaces and a plurality of conductive leads. Each lead has first bonding surfaces on the upper surface of each lead and second bonding surfaces on the lower surface of each lead. Preferably, at least some of the leads include a plurality of third bonding surfaces. A first component is electrically and mechanically coupled to the first bonding surfaces. A second component is electrically and mechanically coupled to the second bonding surfaces. A third component is electrically and mechanically coupled to the third bonding surfaces.

BRIEF DESCRIPTION OF THE DRAWINGS

In the various figures of the drawing, like reference numerals are used to denote like or similar parts.

DETAILED DESCRIPTION OF THE PREFERRED EMBODIMENTS

Figure 1:
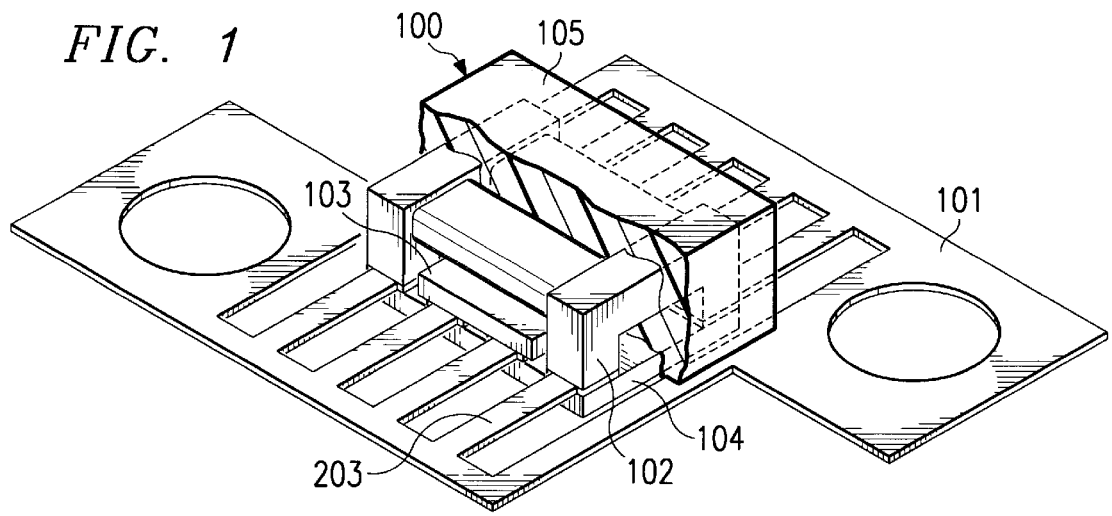
FIG. 1 illustrates in perspective view a multi-component assembly in accordance with the present invention.

The present invention is illustrated in FIG. 1 as a power supply circuit assembly 100 that includes control circuitry formed on an integrated circuit chip 103 assembled with passive components such as capacitor element 104 and an inductor element 102. In a particular example, capacitor element 104 comprises a plurality of capacitors and inductor element 102 comprises a plurality of inductors. Because of the large value of the capacitors and inductors, they cannot be efficiently integrated on the integrated circuit chip. The present invention uses a planar leadframe 101 and vertically stacks the multiple components 102, 103 and 104 about leadframe 101 to provide a highly compact tightly coupled multi-component assembly 100.

Figure 2:
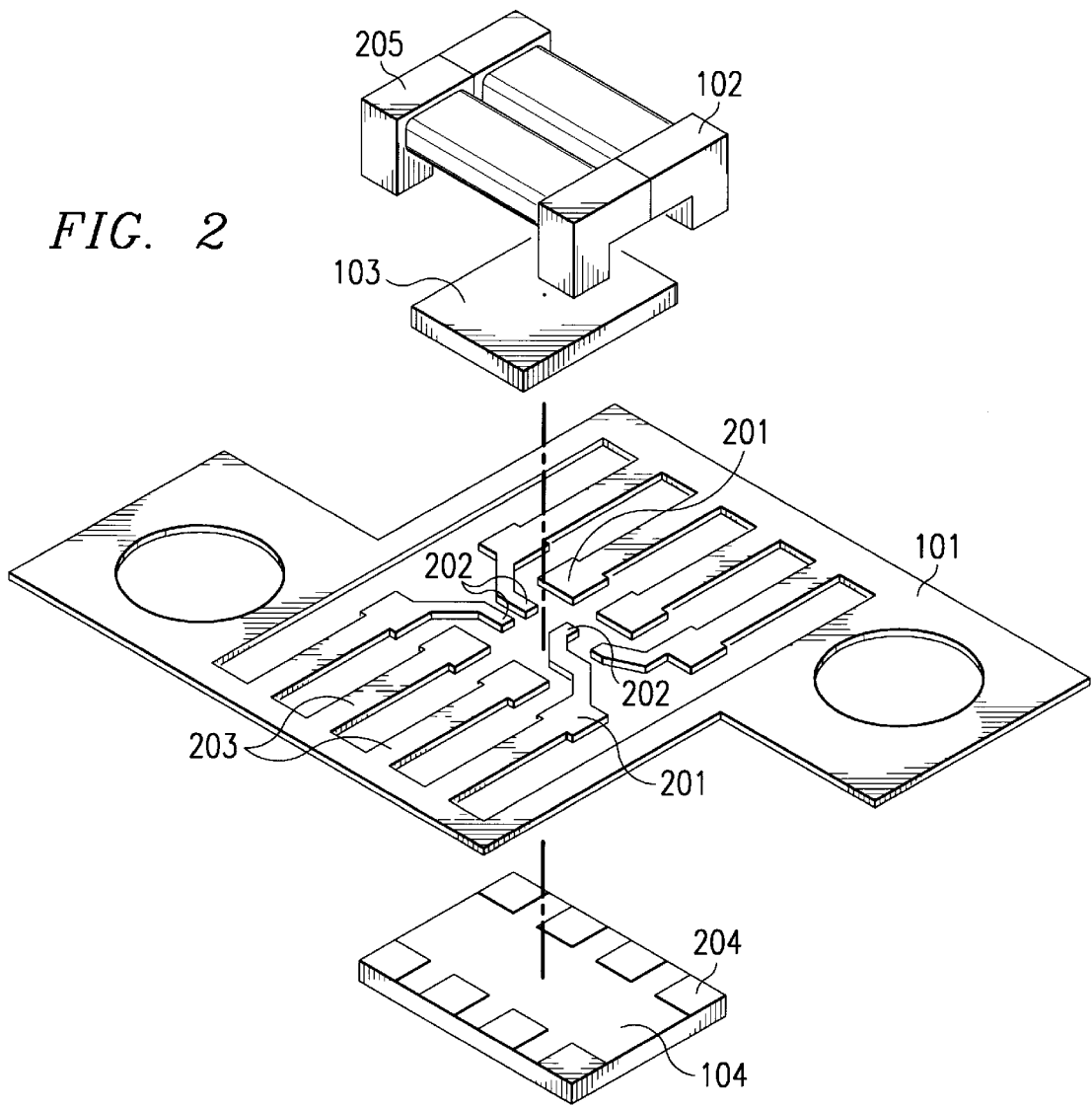
FIG. 2 illustrates the multi-component assembly of FIG. 1 in an exploded perspective view.

As used herein, the terms "planar" and "coplanar" are used to describe the relationship of the upper and lower sides of bonding surfaces 201 as well as bonding surfaces 202 (shown and described in reference to FIG. 2). Although bonding surfaces 201 that are on opposite sides of leadframe 101 are not truly planar, they are considered sufficiently coplanar or planar for purposes of the present invention. After assembly 100 is formed, leadframe 100 it typically trimmed to separate individual leads 203 that extend away from the body of assembly 100. After trimming, the extended portions (i.e., the terminal ends) of leads 203 are bent or formed so that they are no longer coplanar with bonding surfaces 201 and 202 at the interior of assembly 100. As used herein, the terminal ends of leads 203 are not considered "bonding surfaces" even though they will be used to bond assembly 100 to external circuitry such as circuit boards.

While the present invention is described in terms of a particular circuit and is illustrated with some particularity with respect to component shapes, sizes and interconnections, the teachings of the present invention are applicable to any multi-component assembly. The present invention is particularly applicable to assemblies that require tight coupling (i.e., little parasitic inductance between coupled components) and assemblies in which small packaging is particularly important. The particular materials described herein are provided for ease of understanding only, and many equivalent materials are known in the electronic assembly industry.

As shown in FIG. 1, leadframe 101 comprises a stamped or chemically etched substantially planar metal structure. Although a planar leadframe 101 is a particular advantage of the assembly method in accordance with the present invention, a non-planar leadframe can be used in combination with other features of the present invention while still achieving some of the advantages in accordance with the present invention.

Leadframe 101 is formed to have a plurality of leads 203 extending away from the multi-component assembly 100. Leads 203 will be separated from leadframe 101 during a late stage in processing and will provide interconnects to external circuitry (not shown). Typically, multi-component assembly 100 would be encapsulated in an epoxy or plastic encapsulant or enclosed in a metal or ceramic case to provide environmental and physical protection to the components within assembly 100.

In the preferred embodiment, the multi-component assembly includes a capacitor element 104 mounted to the lower surface of leadframe 101. Integrated circuit chip 103 is attached by, for example, solder bumps or conductive epoxy to mounting surfaces on the upper surface of leadframe 101. Inductor element 102 is mounted to selected leads at mounting surfaces set away from the mounting surfaces used to couple to integrated circuit 103. A packaging material such as encapsulant 105 may be used to seal and protect assembly 100. Equivalently, assembly 100 may be sealed in a metal or ceramic encasing or similar package.

FIG. 2 illustrates the structure shown in FIG. 1 in an exploded perspective view that eases understanding of the assembly process. Leadframe 101 includes a plurality of leads 203, some of which contain multiple bonding surfaces. First bonding surfaces 201 are positioned at the outer periphery of subassembly 100. The lower surface of mounting surface 201 is adapted to electrically and mechanically coupled to bonding pads of capacitor element 104. Capacitor element 104 may include one or more capacitors that have capacitor terminals coupled to bonding pads 204. It is not necessary to use all of bonding pads 204 for electrical connection. However, if fewer than all bond pads 204 are required, it is preferred to mechanically attach the unused bond pads 204 to bonding surfaces 201 to provide mechanical support. In the particular example shown in FIG. 2, capacitor element 104 has eight bonding pads 204 that would be mounted by solder bump bonds to the bottom surfaces of mounting surfaces 201.

The upper portion of mounting surfaces 201 is also used to electrically couple to inductor element 205 and/or integrated circuit 103. In the particular example at FIG. 2, inductor element 102 has four bonding pads 205 coupled to inductor terminals within inductor 102. Inductor bonding pads 205 align with and bond to the upper surface of four of bonding pads 201. Integrated circuit 103 includes a plurality of bonding pads (not shown) that mount to the inner four bonding surfaces 201. It is not necessary that electrical connection be made to all of inductor bond pads 203, however, it is recommended that all of bond pads 204 be mechanically attached to available bonding surfaces 201 to provide rigid construction.

Some or all of leads 203 also include second bonding surfaces 202. Second bonding surfaces 202 are aligned to and adapted to mount to integrated circuit bonding pads on integrated circuit 103.

One feature in accordance with the present invention is that leadframe 101 desirably provides bonding surfaces on both the upper and lower surfaces (i.e., upper and lower bonding surfaces 201) of leadframe 101. In addition, multiple bonding surfaces are provided on each lead on any given side (i.e., bonding surfaces 201 and 202). This allows the leadframe 101 to form complex interconnections in both a horizontal and vertical direction. This efficient use of leadframe 101 gives tight electrical and mechanical coupling between components in multi-component assembly 100 and decreases the overall size of multi-component assembly 100 through the use of vertically stacked components. Significantly, even though leadframe 101 is a substantially planar structure, it enables vertical interconnections among the components.

Figure 3:
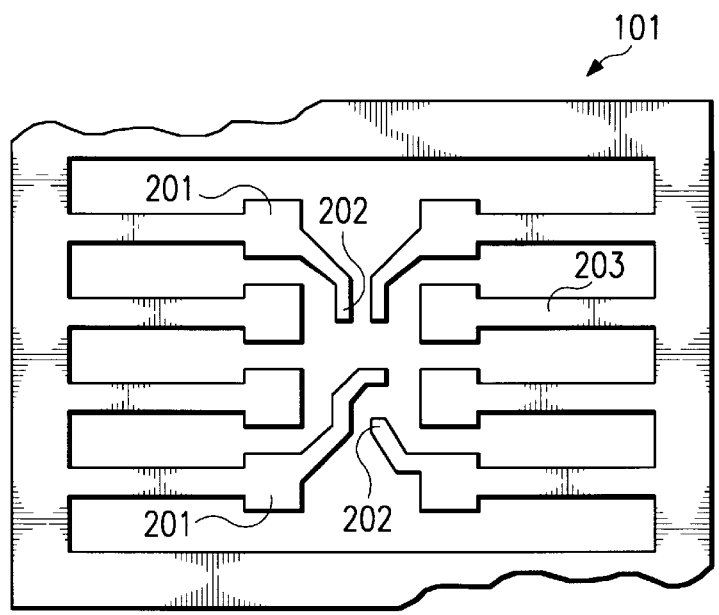
FIG. 3 shows a leadframe useful in manufacturing multi-component circuit in accordance with the present invention.

FIG. 3 illustrates leadframe 101 in greater detail. Leadframe 101 may include any number of leads 203. Also, leads 203 may take any convenient shape to make interconnections to the various components. Each lead 203 has at least two bonding surfaces and several leads 203 include three bonding surfaces. The first set of bonding surfaces comprises bonding surfaces 201 located on the upper side of leadframe 101. The second set of bonding surface comprises bonding surfaces 201 on the lower surface of leadframe 101 for coupling to the capacitor element 104. Third bonding surfaces 202 are formed as extensions of leads 203 that extend into the central portion of leadframe 101 and are adapted to couple to bond pads 401 (shown in FIG. 4) on integrated circuit 103.

Figure 4:
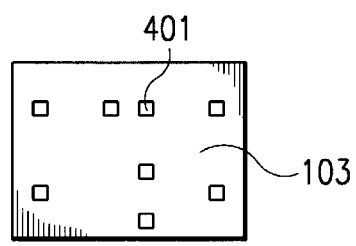
FIG. 4 illustrates an integrated circuit chip for mounting on the leadframe shown in FIG. 3.

Integrated circuit 103 is shown in greater detail in the plan view of FIG. 4. Any type of circuitry may be formed on IC 103 in any available technology. Bond pads 401 are preferably coated with a thin layer of solder or other flowable metal such as gold. Alternatively, conductive filled polymer or epoxy may be used to enhance electrical coupling between bond pads 401 and bonding surfaces 202 (shown in FIG. 3). Integrated circuit 103 may also be implemented as multiple chips mounted adjacent to each other.

Figure 5:
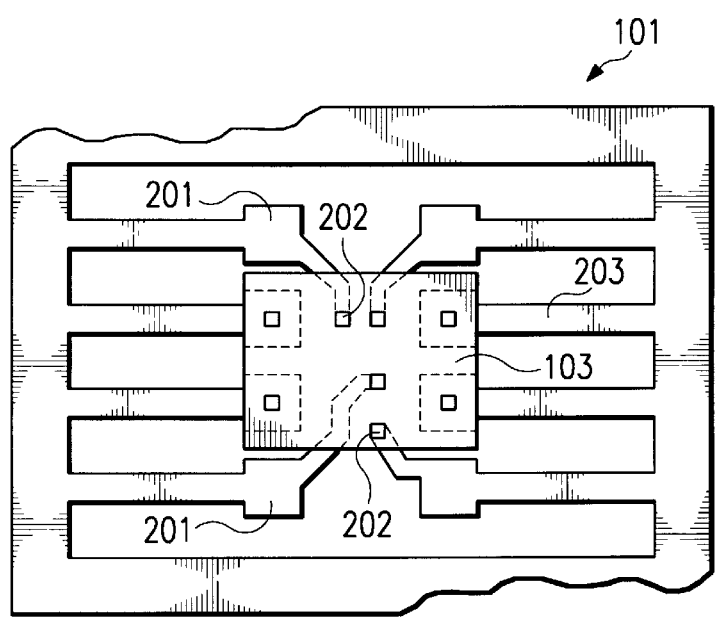
FIG. 5 illustrates the integrated circuit of FIG. 4 mounted on a leadframe of FIG. 3.

FIG. 5 shows IC 103 mounted to leadframe 101 in accordance with a preferred embodiment. It can be seen that some of bond pads 401 couple to first bond surfaces 201. Others of bond pads 401 are coupled to third bond surfaces 202. This leaves exposed bond surfaces 201 on the upper surface of leadframe 101 for coupling to inductor element 102. This also leaves all eight of the lower bond surfaces 201 under leadframe 101 available for coupling to the eight bond pads of capacitor 104.

By now it should be appreciated that a central side leadframe design is provided that allows vertically stacked components with a planar leadframe. Because the planar leadframe is used, assembly costs are reduced. Because the integrated circuit component is sandwiched between two passive components, it is protected from external environment. The multi-component assembly 100 in accordance with the present invention hence is more rugged and provides improved performance due to the tight coupling and low inductance coupling between the integrated circuit and passive components.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A multi-component electronic assembly comprising:
   a leadframe having upper and lower surfaces and a plurality of conductive leads, each lead having first bonding surfaces on the upper surface of each lead, second bonding surfaces on the lower surface of each lead, and third bonding surfaces formed on at least some of the plurality of leads;
   an integrated circuit having top and bottom surfaces, wherein the integrated circuit is electrically and mechanically coupled to the first bonding surfaces;
   a first passive component electrically and mechanically coupled to the second bonding surfaces so as to protect the top surface of the integrated circuit; and
   a second passive component electrically and mechanically coupled to the third bonding surfaces so as to protect the bottom surface of the integrated circuit.

2. The multi-component electronic assembly of claim 1 wherein the first bonding surfaces are formed by conductive extensions of the leads that extend towards the center of the assembly.

3. The multi-component electronic assembly of claim 1 wherein the first and second passive components are vertically aligned with the integrated circuit.

4. The multi-component electronic assembly of claim 2 wherein the integrated circuit comprises a plurality of bonding pads on the top surface and the bonding pads are electrically and mechanically coupled to the first bonding surfaces of the leadframe by solder bumps.

5. The multi-component electronic assembly of claim 1 wherein the first and second bonding surfaces of the leadframe are substantially coplanar.

6. The multi-component electronic assembly of claim 1 wherein the first and second passive components are electrically and mechanically coupled to the bonding surfaces by solder bumps.

7. The multi-component electronic assembly of claim 1 wherein the first passive component is an inductor element comprising multiple inductors and the second passive component is a capacitor element comprising multiple capacitors.

8. An electronic assembly comprising:
   a leadframe having a plurality of leads, each of said leads having a pair of opposing surfaces;
   a semiconductor integrated circuit having an upper surface and an opposing lower surface, said integrated circuit mounted to a said surface of said leadframe, said integrated circuit comprising a plurality of bond pads on said upper surface electrically coupled to leads of the leadframe;
   a first passive component mechanically attached to the leadframe and disposed over the upper surface of said integrated circuit to shield the upper surface of the integrated circuit, said first passive component being electrically attached to the leadframe so as to electrically cooperate with the integrated circuit; and
   a second passive component mechanically attached to the leadframe and disposed over the lower surface of said integrated circuit to shield the lower surface of the integrated circuit, said second passive component being electrically attached to the leadframe so as to electrically cooperate with the integrated circuit.

9. The electronic assembly of claim 8 further comprising an encapsulant surrounding the integrated circuit, first passive component, and second passive component and portions of the leadframe, wherein leads of the leadframe extend outward from the encapsulant for electrical connection to external circuitry.

* * * * *